United States Patent
Rogenmoser

(10) Patent No.: US 6,271,684 B1
(45) Date of Patent: Aug. 7, 2001

(54) METHOD AND APPARATUS FOR STALLING OTB DOMINO CIRCUITS

(75) Inventor: Robert Rogenmoser, Santa Clara, CA (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 09/289,770

(22) Filed: Apr. 8, 1999

(51) Int. Cl.[7] .................................................. H01F 27/02
(52) U.S. Cl. ..................... 326/95; 326/93; 326/98
(58) Field of Search ...................... 326/17, 93, 95–98

(56) References Cited

U.S. PATENT DOCUMENTS

| 5,392,423 | * | 2/1995 | Yetter ................................... 395/550 |
| 5,402,012 | | 3/1995 | Thomas .................................. 326/97 |
| 5,453,708 | | 9/1995 | Gupta et al. ........................... 326/98 |
| 5,517,136 | | 5/1996 | Harris .................................... 326/93 |
| 5,661,675 | * | 8/1997 | Chin et al. ............................ 364/768 |
| 5,764,089 | * | 6/1998 | Partovi et al. ....................... 327/200 |
| 6,060,910 | * | 5/2000 | Inui ....................................... 326/98 |
| 6,069,496 | * | 5/2000 | Perez ..................................... 326/98 |
| 6,111,434 | * | 8/2000 | Ciraula et al. ......................... 326/98 |

OTHER PUBLICATIONS

IEEE Journal of Solid–State Circuits, "Special Issue on the 1997 ISSCC: Digital, Memory and Signal Processing", Nov. 1997, vol. 32, No. 11, pp. 1702–1711.

David Harris et al., ISSCC97/Session 25/Processors and Logic/Paper SP 25.7: "Skew–Tolerant Domino Circuits", Digest of Technical Papers, Feb. 8, 1997, pp. 422–423.

* cited by examiner

Primary Examiner—Michael Tokar
Assistant Examiner—Vibol Tan
(74) Attorney, Agent, or Firm—Blakely, Sokoloff, Taylor & Zafman LLP

(57) ABSTRACT

A circuit for stalling data in a domino pipeline. The circuit includes a logic network having multiple inputs coupled to receive multiple input data signals. The logic network generates an output signal on an output node based on a logic evaluation of the multiple input data signals. The circuit also includes a feedback circuit coupled to the logic network to maintain the output signal on the output node based on a stall input signal.

19 Claims, 9 Drawing Sheets

METHOD AND APPARATUS FOR STALLING OTB DOMINO CIRCUITS

FIELD OF THE INVENTION

This invention relates to the field of logic circuits and, more specifically, to logic circuits designed for high speed operation.

BACKGROUND

The microprocessor industry is developing circuits with shorter and shorter cycle times. Microprocessor designers seeking higher performance are reducing cycle times beyond that which simple process geometry scaling may achieve by using domino logic circuits in a pipeline configuration. The speed of the data path, however, is slowed by the time required to precharge sets of the domino logic circuits in the pipeline.

Domino circuits are used to evaluate a logic operation based on data input to the circuit. The logic operation can be performed within one or more logic stages. Where multiple stages are present, an evaluation of one stage is rippled, or dominoed, through the various stages, with each subsequent stage performing its evaluation based on the previous evaluation. After the completion of the evaluation in the final stage, an output is provided from the domino circuit through an output latch.

Data transfer speed through the domino logic circuits can be increased by electrically precharging a series of logic gates during a first clock phase, and then evaluating the intended logic function during the next clock phase. The critical data path is pipelined in domino logic so that a portion of the domino gates are precharging while another portion of domino gates are evaluating. In traditional domino pipelines, the critical data path is divided into half-cycles where during one half-cycle domino logic gates are precharging and in the other half cycle the domino logic gates are evaluating.

Opportunistic time-borrowing (OTB) domino systems allow for domino pipelines without latches between phase boundaries. In processors, however, the pipeline may need to be stalled due to, for examples, interrupts and data dependencies. In one prior art system, enable latches are inserted between OTB domino phases. When a stall occurs, these latches hold their current value until the stall is released, thereby conserving the current state of the pipeline stage for one to several clock cycles.

FIG. 1A illustrates a prior art domino gate 20 used at the start of a half cycle in a domino pipeline. Domino gate 20 is the first domino gate in a new half cycle. The domino gate 20 consists of an NMOS logic network that performs some predetermined logic function in the pipeline. The logic function is performed using inputs (three shown) received from enable latches 30, 40, and 50 illustrated in FIG. 1B. The enable latch of FIG. 1B requires the enable input (EN) to select between new data at input D and the stored state of data input to the enable latch in a previous cycle. In this manner, the enable latches 30, 40, and 50 hold data from a previous half cycle until the domino gate 20 is ready to process the data.

One problem with such a system is that an additional delay between the previous domino gate and the next phase domino gate is inserted, thereby burdening the critical data path with significant time delay. In addition, the enable signal needs to be strong enough to drive as many latches as inputs that exist in the next phase domino circuit, resulting in a significant design challenge.

SUMMARY OF THE INVENTION

A circuit for stalling data in a domino pipeline is described. The circuit includes a logic network having multiple inputs coupled to receive multiple input data signals. The logic network generates an output signal on an output node based on a logic evaluation of the multiple input data signals. The circuit also includes a feedback circuit coupled to the logic network to maintain the output signal on the output node based on a stall input signal.

Additional features and advantages of the present invention will be apparent from the accompanying drawings and from the detailed description that follows.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION

In the following description, numerous specific details are set forth such as examples of specific circuits, components, parameters, dimensions, etc. in order to provide a thorough understanding of the present invention. It will be obvious, however, to one skilled in the art that these specific details need not be employed to practice the present invention. In other instances, well known components or methods have not been described in detail in order to avoid unnecessarily obscuring the present invention.

The circuits described herein are illustrated using CMOS components. It should be noted, however, that these circuits may also be designed using Bipolar, NMOS, PMOS, or BiCMOS components. In addition, VCC and VSS are used to represent voltage supplies utilized by the illustrated circuits.

Figure 1A:
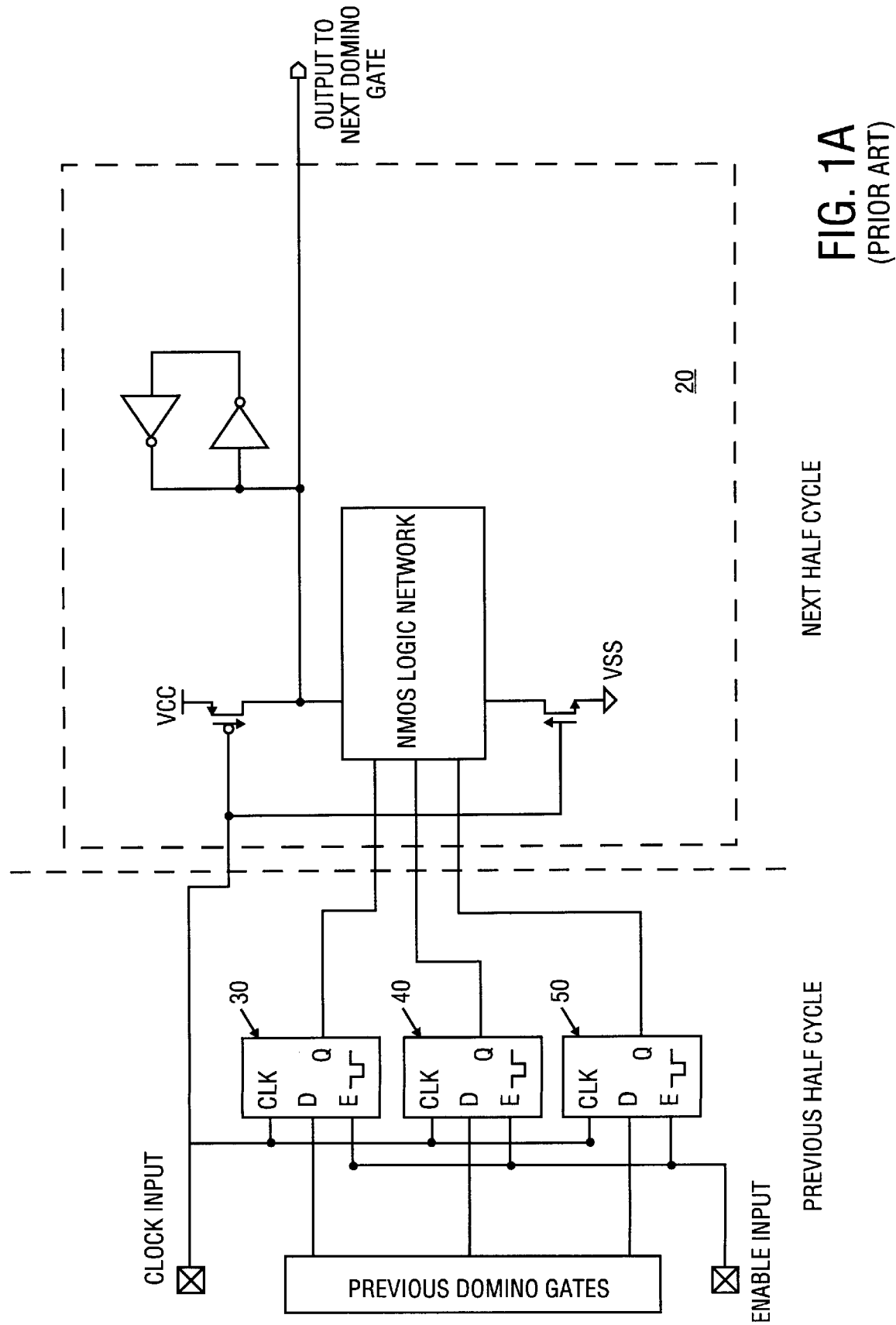
FIG. 1A illustrates a prior art domino gate used at the start of a half cycle in a domino pipeline.
Figure 1B:
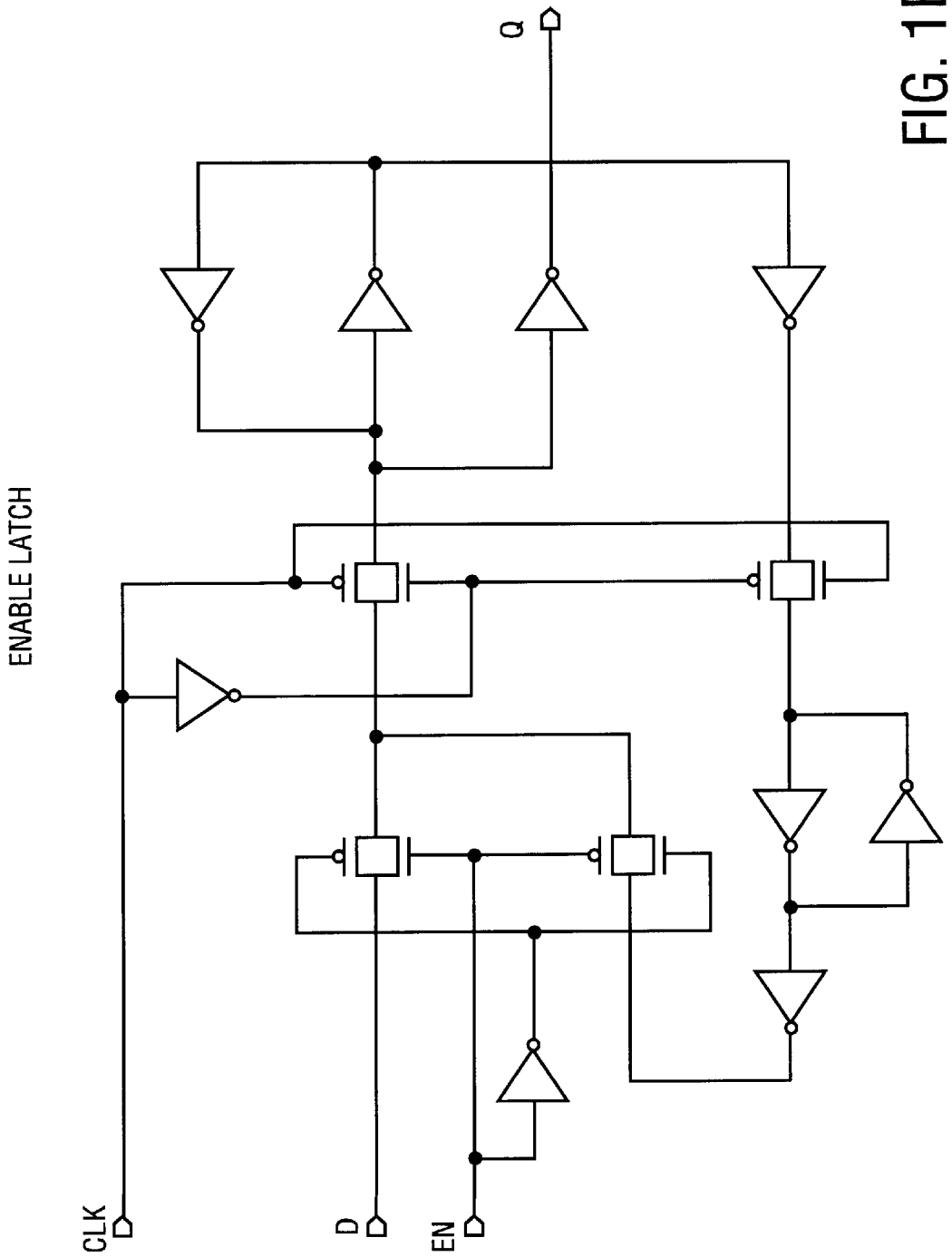
FIG. 1B illustrates a prior art enable latch.
Figure 2:
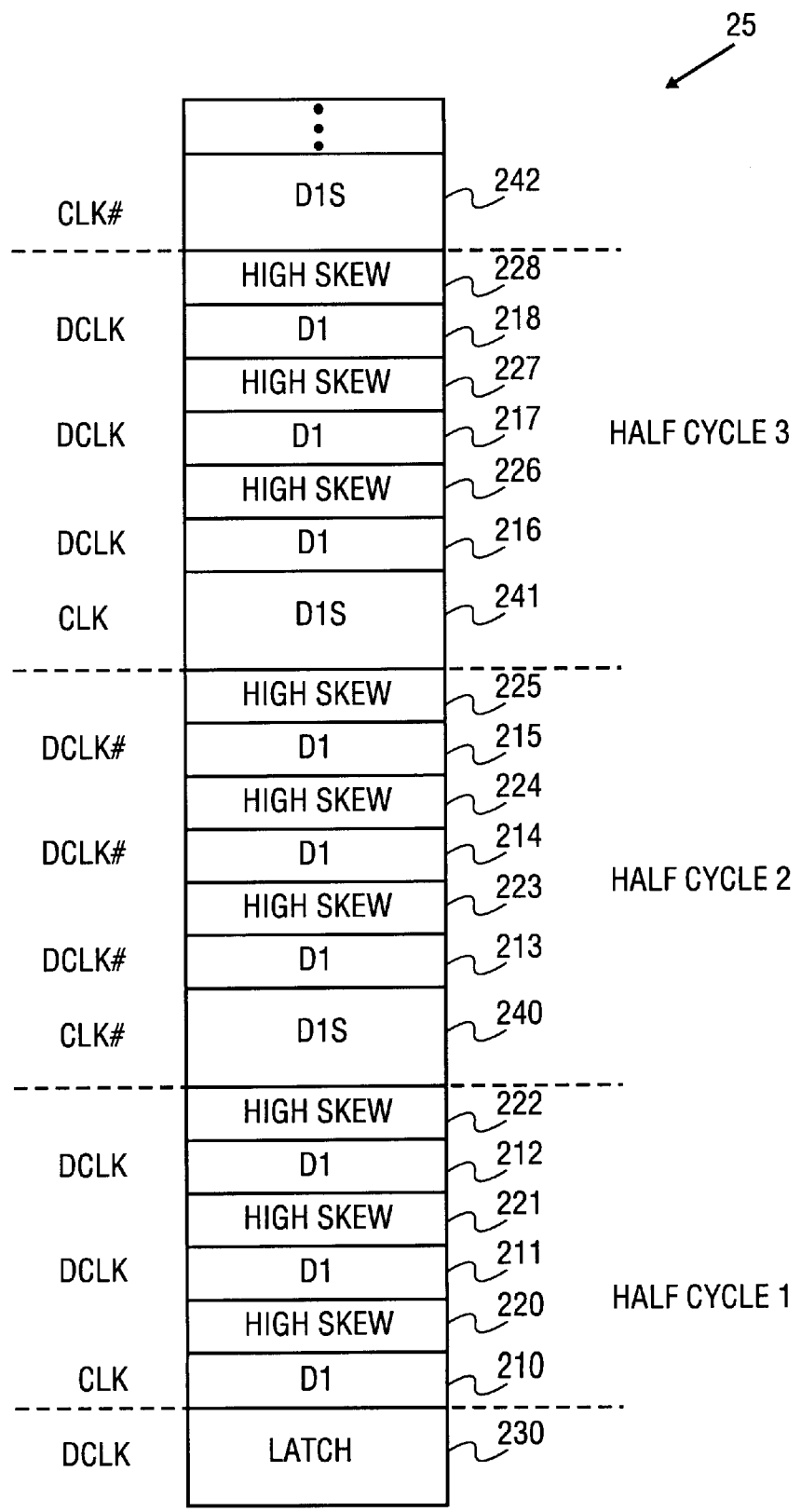
FIG. 2 illustrates one embodiment of an opportunistic time-borrowing pipeline in a processor.

FIG. 2 illustrates one embodiment of an opportunistic time-borrowing pipeline in a processor. The signal propagation in FIG. 2 is from the bottom to the top of the figure. In an opportunistic time-borrowing (OTB) domino pipeline 25, time is borrowed from clock half cycles that complete in a shorter time than expected for use in longer half cycles. The domino pipeline 25 includes domino blocks 240–242, and domino logic gates 210–218 coupled with high skew logic gates 220–228 in series. Domino logic gates 210–218 are standard logic gates used in domino pipeline designs. The design of these standard logic gates 210–218 are well known in the art and, thus, the details are not discussed herein. In one embodiment, for example, the standard logic gates 210–218 may be of a design similar to that of domino logic 20 of FIG. 1.

It should also be noted that although a forward time-borrowing scheme is illustrated, the embodiments described below may also be implemented in a backward time-borrowing scheme.

Figure 3:
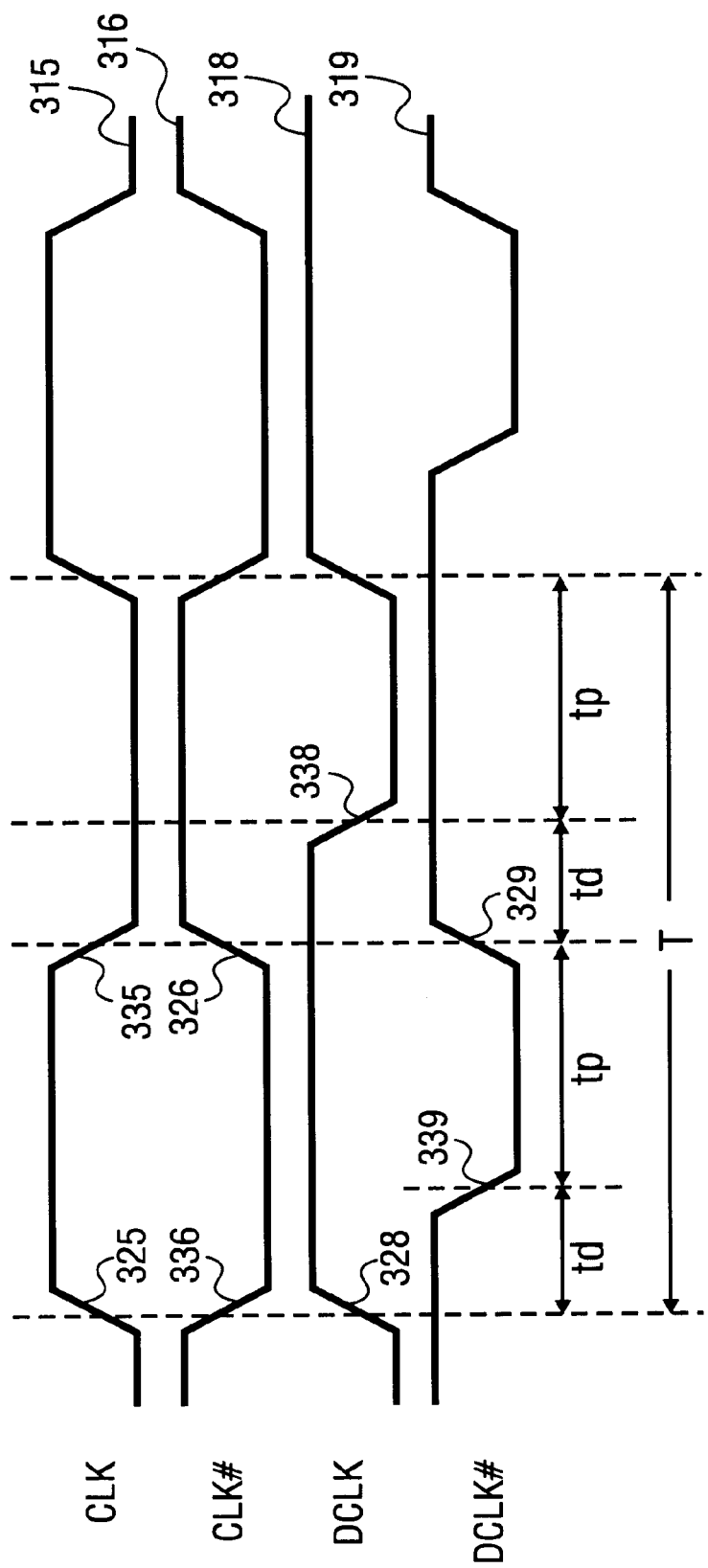
FIG. 3 illustrates timing diagrams of clock signals in the processor.

FIG. 3 illustrates timing diagrams of clock signals in the processor. In one embodiment, the domino pipeline utilizes four clock signals that may be generated by a local reference circuit driven by the processor's global reference clock signal (not shown). Clock signal (CLK) 315 is a standard clock signal having a 50% duty cycle. In one embodiment, the frequency of CLK 315 is 500 MHz. In other embodiments, CLK 315 can be set to other frequencies. A second clock signal CLK#316 is the complement of clock signal CLK 315. Clock signals DCLK 318 and DCLK#319 are delayed clock signals with rising edges 328 and 329, respectively, substantially synchronous with the rising edges 325 and 326 of signals CLK 315 and CLK#316, respectively. Clock signals DCLK 318 and DCLK#319 also have falling edges 338 and 339, respectively, delayed with respect to the falling edges 335 and 336 of CLK 315 and CLK#316, respectively. The time delay between the falling edge of either CLK 315 and DCLK 318, or CLK#316 and DCLK#319 is denoted by $t_d$. Domino logic evaluation is done using the delayed falling edges 338 and 339 of DCLK 318 and DCLK#319 so that evaluation can continue into subsequent half cycles to accomplish forward time borrowing as discussed below in further detail. The precharge time is denoted by $t_p$ and, thus, the full period of any of the four clock signals is denoted by T.

Figure 4:
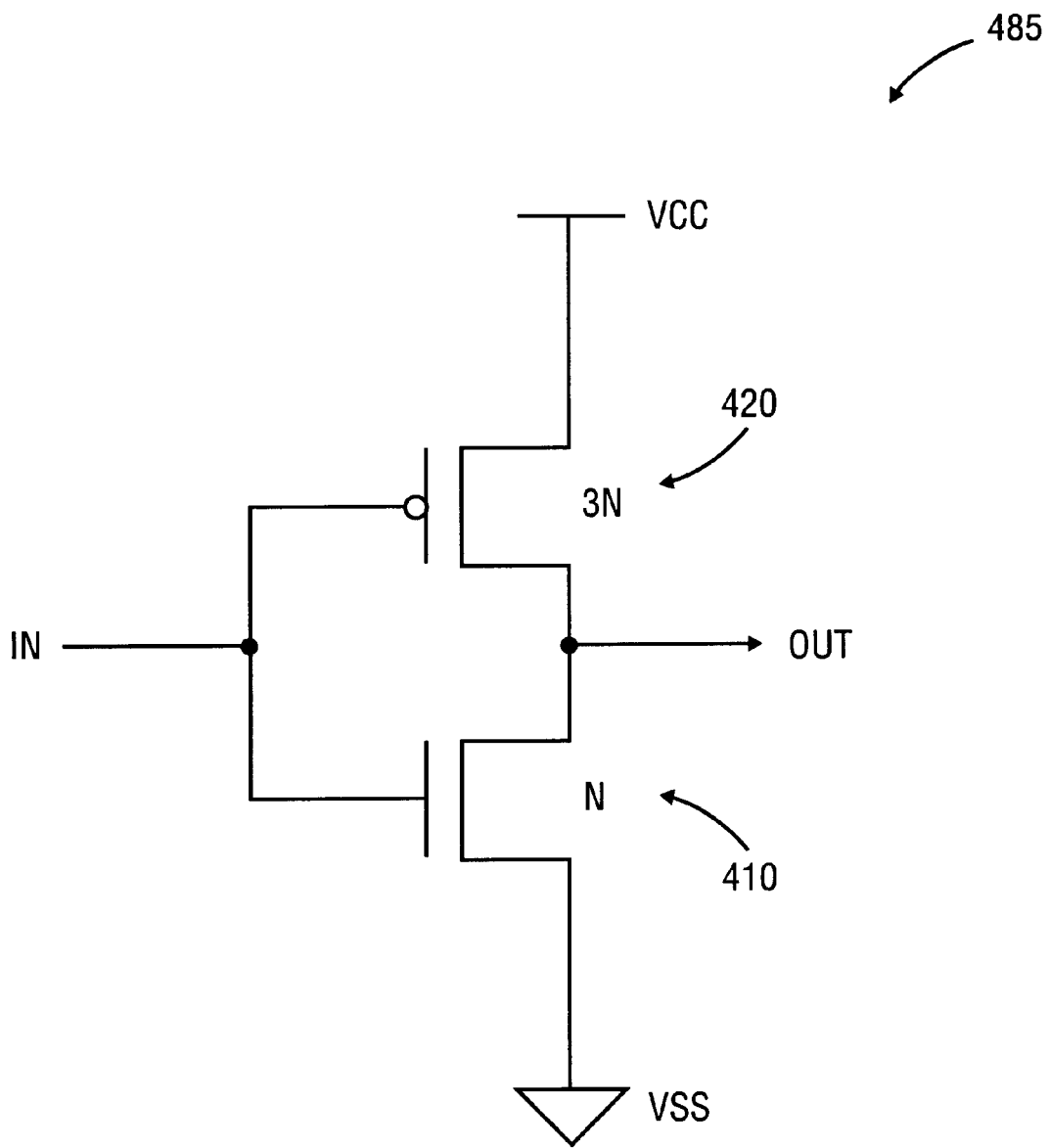
FIG. 4 illustrates an embodiment of a high skew logic gate used in the pipeline.

FIG. 4 illustrates an embodiment of a high skew logic gate used in the pipeline. In one embodiment, the high skew logic gate 485 is a CMOS inverter in which the n-channel device 410 has a dimension N and the p-channel device 420 has a dimension of approximately 3N. The larger dimension of the p-channel device provides for rapid low to high transitions. It should be noted, however, that other configurations for the high skew logic gate may be used as is well known in the art.

Referring back to FIG. 2, the input to the domino pipeline arrives from a latch 230 that receives a data signal from earlier circuitry (not shown). The various clock signals (CLK, CLK#, DCLK, and DCLK#) coupled to each of the logic devices are illustrated adjacent to each of the gates 210–218. The domino pipeline example of FIG. 2 is structured such that each domino gate is followed by a high skew gate. In the domino pipeline, when the output of a domino gate falls low, the output of the following high skew gate rises, allowing for rapid low to high transitions.

In one embodiment, half cycle 1 and half cycle 3 evaluate at a time when CLK is high, and half cycle 2 evaluates on CLK being low. The half cycle 1 begins to evaluate on CLK with subsequent domino gates evaluating on DCLK so that they may borrow time from half cycle 2 if needed. Since DCLK has a delayed falling edge, the last gate in half cycle 1 remains active high in evaluation when the first gate in half cycle 2 begins evaluating. The time overlap allows half cycle 2 to begin evaluating prior to the falling edge of the half cycle 1 stage.

The first domino gate in half cycle 1 and half cycle 3 is clocked with either CLK or CLK# to prevent a signal race condition. A race condition occurs when signals are not received at the proper time resulting in a corruption of data that is propagated through the pipeline. Later in a half cycle, DCLK is utilized for time borrowing. Controlling the first gate in the first half cycle with CLK or CLK# does not impact time borrowing because there is no need to borrow time through the first stage. A D1S domino block 240 is used as the first gate in half cycle 2 because it retains its output value even after half cycle 1 precharges.

As discussed above with respect to FIG. 1, prior art domino pipelines use enable latches inserted in the data path before the first domino gate in a half cycle to stall the pipeline. The enable latches hold the data outputs from the previous domino gate as many clock cycles as the pipeline is stalled. Since inputs to domino gate are stalled, the critical data path is burdened with a time delay through the enable latches. Furthermore, time-borrowing is not possible since an evaluation must complete before the enable latch closes at the end of a half cycle.

The D1S domino block 240 of FIG. 2 obviates the need for latches in the critical path at the half cycle inputs by recirculating the output of the domino block as described in further detail below. By eliminating latches in the domino chain, propagation delay time may be reduced. As such, in one embodiment, an opportunistic time borrowing domino pipeline may be stalled without breaking the pipeline and without adding storage elements in the data path.

Figure 5:
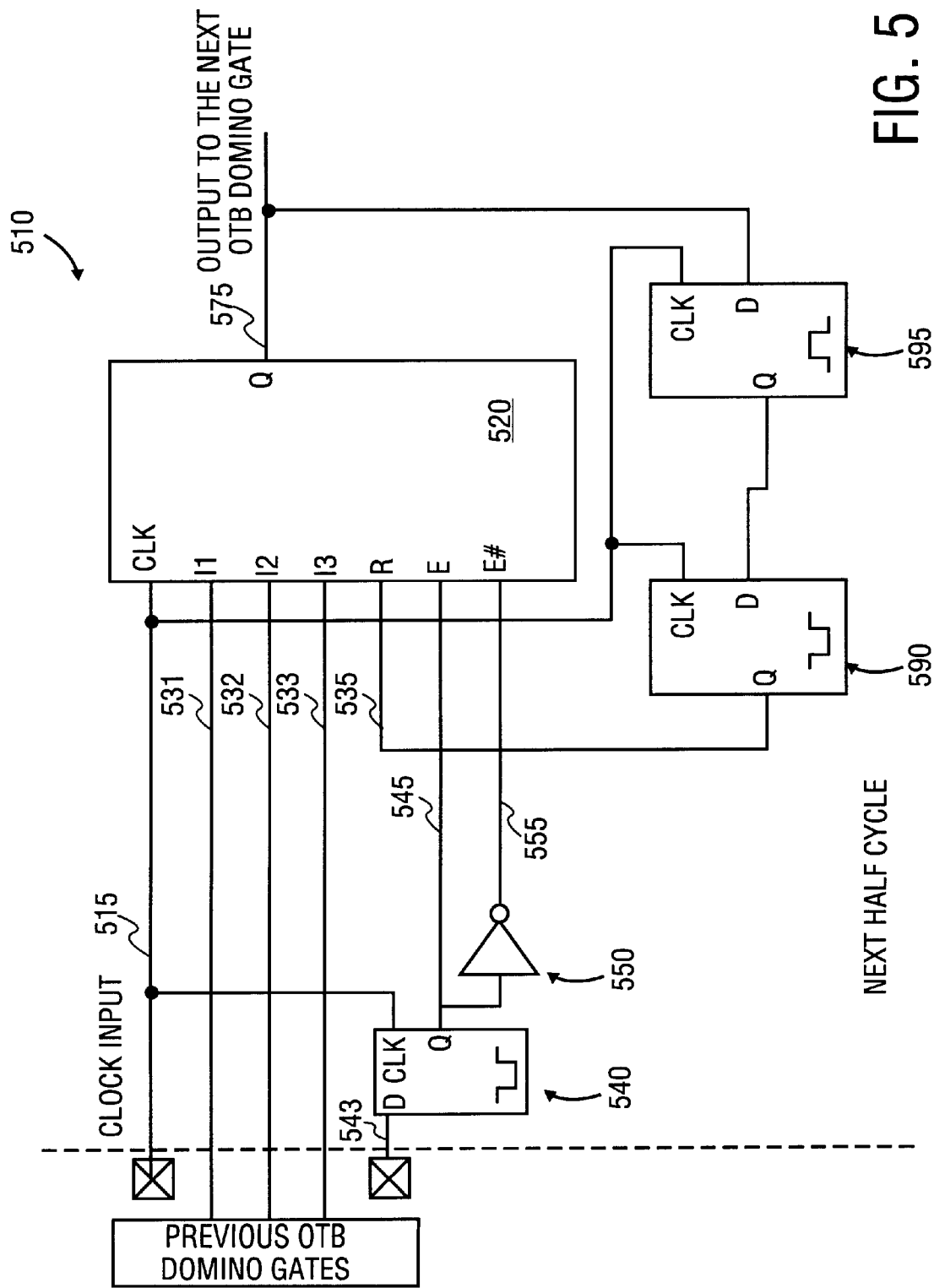
FIG. 5 illustrates one embodiment of a domino block.

FIG. 5 illustrates one embodiment of a domino block that allows for stalling of data signals in opportunistic time-borrowing domino pipelines without adding storage elements in the critical data path. A recirculating structure is used to keep the OTB domino pipeline intact by modifying the first domino gate in a new half cycle to have a recirculating input. Domino block 520 is shown in FIG. 5 having three data inputs 531, 532, and 533, only for illustrative purposes. In other embodiments, domino block 520 may be designed to accommodate a different number of data inputs. In addition to the data inputs, domino block 520 also has a recirculating input 535, an enable input 545, and a stall input 555. Output 575 is connected to the input of the next domino gate.

The recirculating input 535 is activated by stall input 555. In a domino pipeline, the inputs to a domino gate must be kept stable to prevent the output of the domino gate from becoming corrupted. An enable signal 543 is applied to the data input of latch 540 with enable input 545 generated as the output of latch 540. Stall input 555 is generated using an inverter 550 coupled to enable input 545. Low transparent latch 540 is used to keep the enable input 545 and the stall input 555 stable before the domino block 520 begins evaluating.

The output 575 of domino block 520 is also used as an input to the domino block 520. Output 575 is fed back to recirculating input 535 through high transparent latch 595 and low transparent latch 590. High transparent latch 595 and low transparent latch 590 are used to maintain the recirculating input 535 to domino block 520 stable during an evaluation before the CLK signal 515 edge rises. Latch 595 is a high transparent latch such that data is passed through when the clock input 515 is high. Latch 590 is a low transparent latch such that data is passed through the latch when the clock input 515 is low. When CLK 515 is high, low transparent latch 590 closes and data from the output 575 of the domino block 520 is passed through low transparent latch 590. When CLK 515 goes low, then low transparent latch 590 will maintain data to the recirculating input 535 corresponding the value of the data on output 575. This recirculating structure is used to preserve the output of the previous cycle while the next domino gate completes its evaluation without adding delay to the inputs of the domino block as discussed in further detail below.

Figure 6:
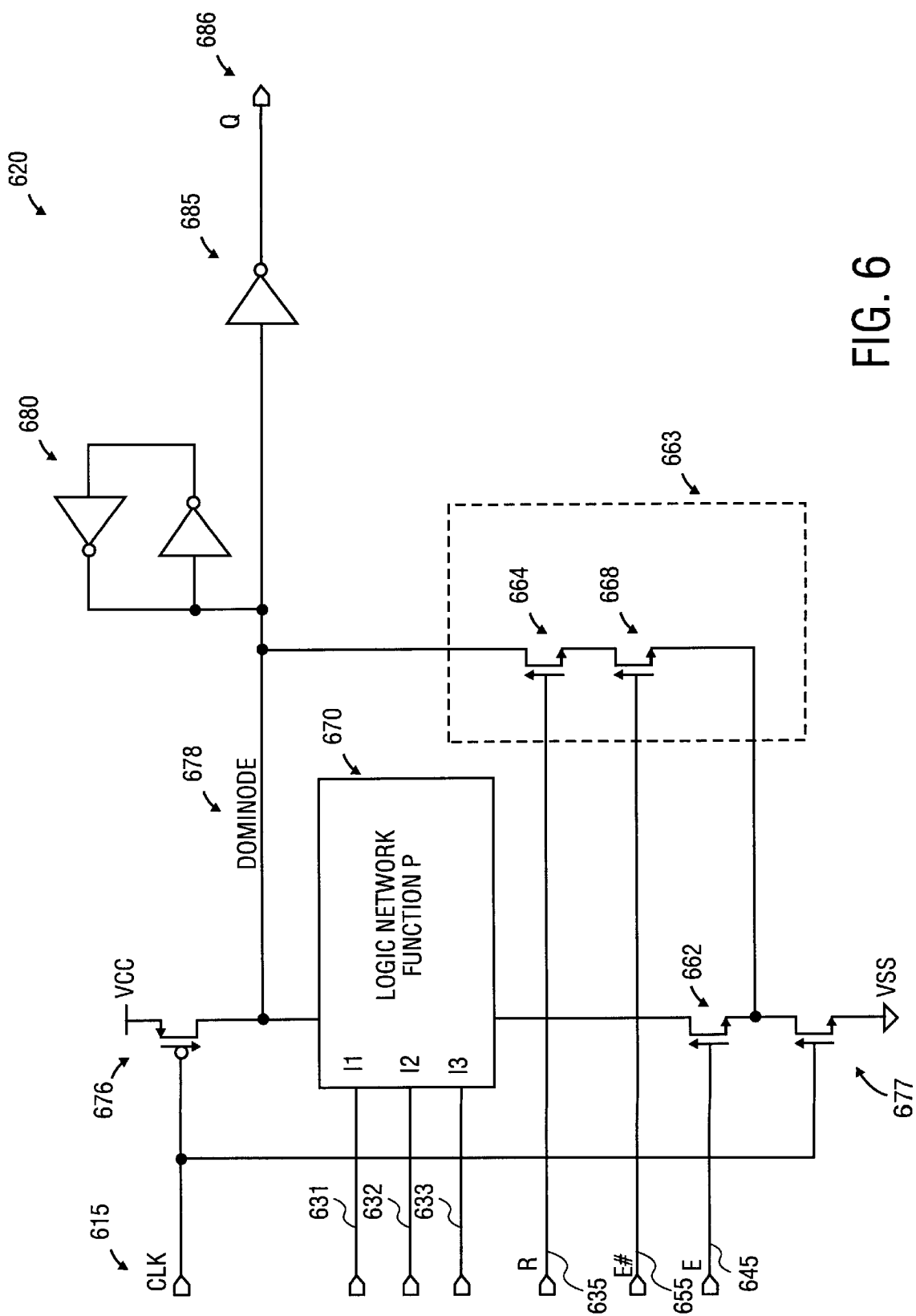
FIG. 6 illustrates one embodiment of a domino gate.

FIG. 6 illustrates one embodiment of a domino. The domino gate 620 includes a logic network 670, a p-channel transistor 676, and a n-channel transistor 677, similar to the domino gate of FIG. 1A. However, data inputs 631, 632, and 633 to logic network 670 are received directly from previous domino gates rather than from latches. In one embodiment, logic network 670 consists of NMOS transistors coupled together to perform a predetermined logic function P in the domino pipeline, for example, a NOR function or a NAND function. In other embodiments, logic network 670 consists of other types of transistors and is designed to perform other logic functions.

Clock input (CLK) 615 is coupled to the gates of transistors 676 and 677, and controls the operation of the logic network 670 when enable is on, or high, indicating that a stall is not desired. In a precharge cycle, CLK 615 is low causing transistor 676 to conduct to precharge node 678 to a logic "1" state. In an evaluation cycle, CLK 615 is high causing transistor 676 to turn off and transistor 677 to conduct. When transistor 677 conducts, the logic network 670 will output its logic function P to dominode 678. In one embodiment, domino block 620 also includes a pair of inverters 680 coupled in a series ring to dominode 678. The pair of inverters 480 is used to prevent output node 678 from floating to preventing corruption of the data. In an alternative embodiment, the domino gate 620 also contains high skew logic gate 685 coupled to the dominode 678 to allow for rapid low to high data transitions. The high skew logic gate 685 inverts the output signal on dominode 678 to produce domino block output (Q) 686.

The domino gate 620 also includes a circuit branch 633 placed in parallel with logic network 670 and an additional n-channel transistor 662. In one embodiment, n-channel transistor 662 is included in between the logic network 670 and n-channel transistor 677. The n-channel transistor 662 is controlled by the enable input (E) 645 such that when enable input 645 is high (designating that there is no stall required), the logic network 670 will operate as discussed above in response to the clock signal on CLK 615. In an alternative embodiment, the n-channel transistor 662 is coupled in between the logic network 670 and dominode 678 and performs the same function as previously described.

If a stall is required, however, at the start of an evaluation cycle, a low signal is applied to enable input 645 and the function P of logic network 670 is blocked. Correspondingly, the signal on stall input (E#) 655 will be high, activating parallel circuit branch 663. Circuit branch 63 has two n-channel transistors 664 and 668 in series. The drain of transistor 664 is coupled to dominode 678. The drain of transistor 668 is coupled to the source of transistor 664 and the source of transistor 668 is coupled to the drain of transistor 677. It should be noted that the position of transistors 664 and 668 relative to each other is not critical. In an alternative embodiment, the position of n-channel transistors 664 and 668 relative to each other is switched such that the drain of transistor 668 is connected to dominode 678, and transistor 664 is coupled between the drain of transistor 677 and the source of transistor 668.

The stall signal 655 is coupled to the gate of n-channel transistor 668 and the recirculating input (R) 635 is coupled to the gate of n-channel transistor 664. When the stall is on, circuit branch 663 is selected and the output on dominode 678 is determined by the recirculating input 635 which carries the data value from the previous cycle. When the stall is off, the additional circuit branch 663 does not influence the output function. For one embodiment, the Boolean equation for the recirculating domino gate 620 is given by:

if CLK is high, then $$Q=NOT(P*E+R*E\#)$$

else $$Q=\text{low}$$

Figure 7A:
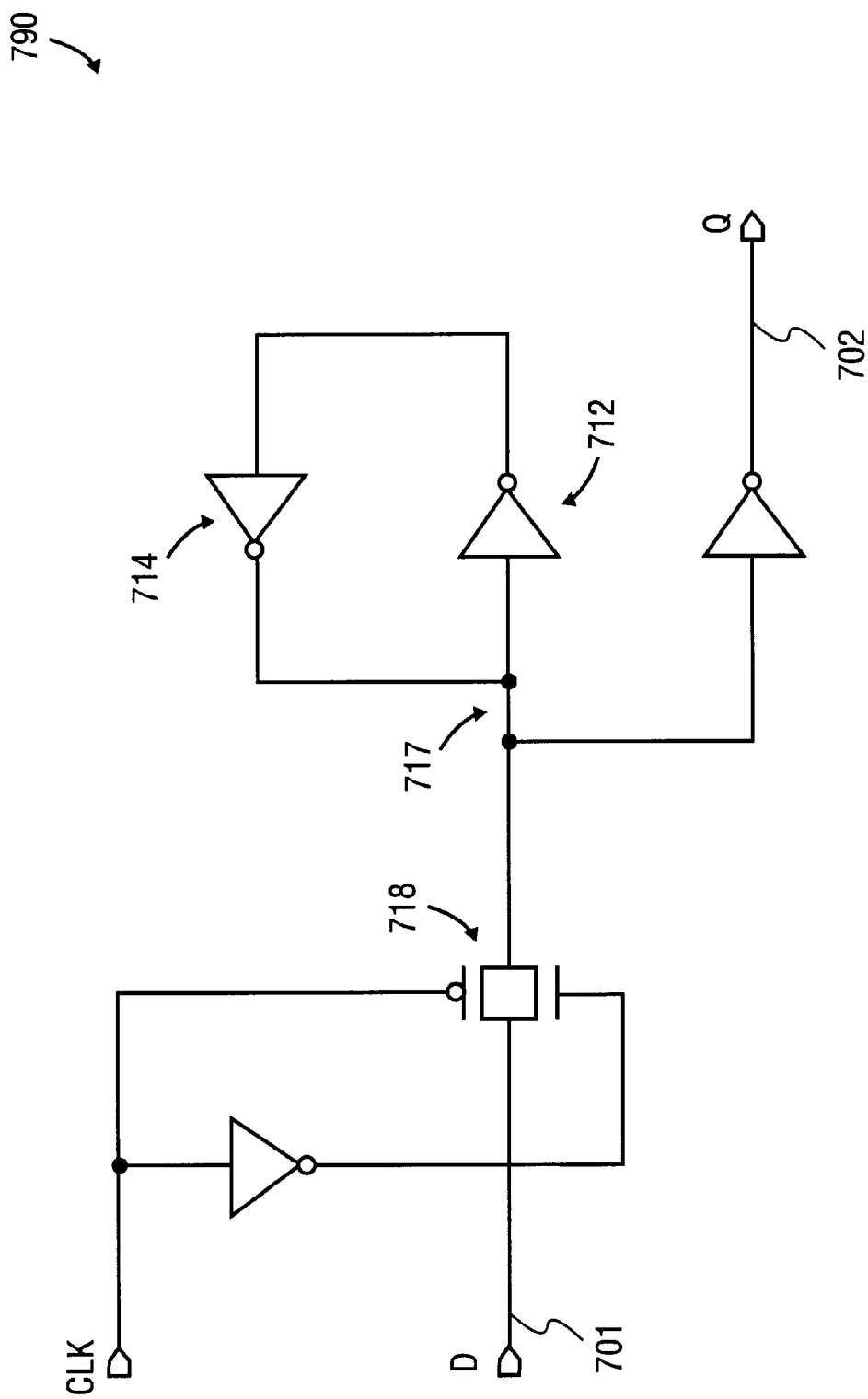
FIG. 7A illustrates one embodiment of a low transparent latch.
Figure 7B:
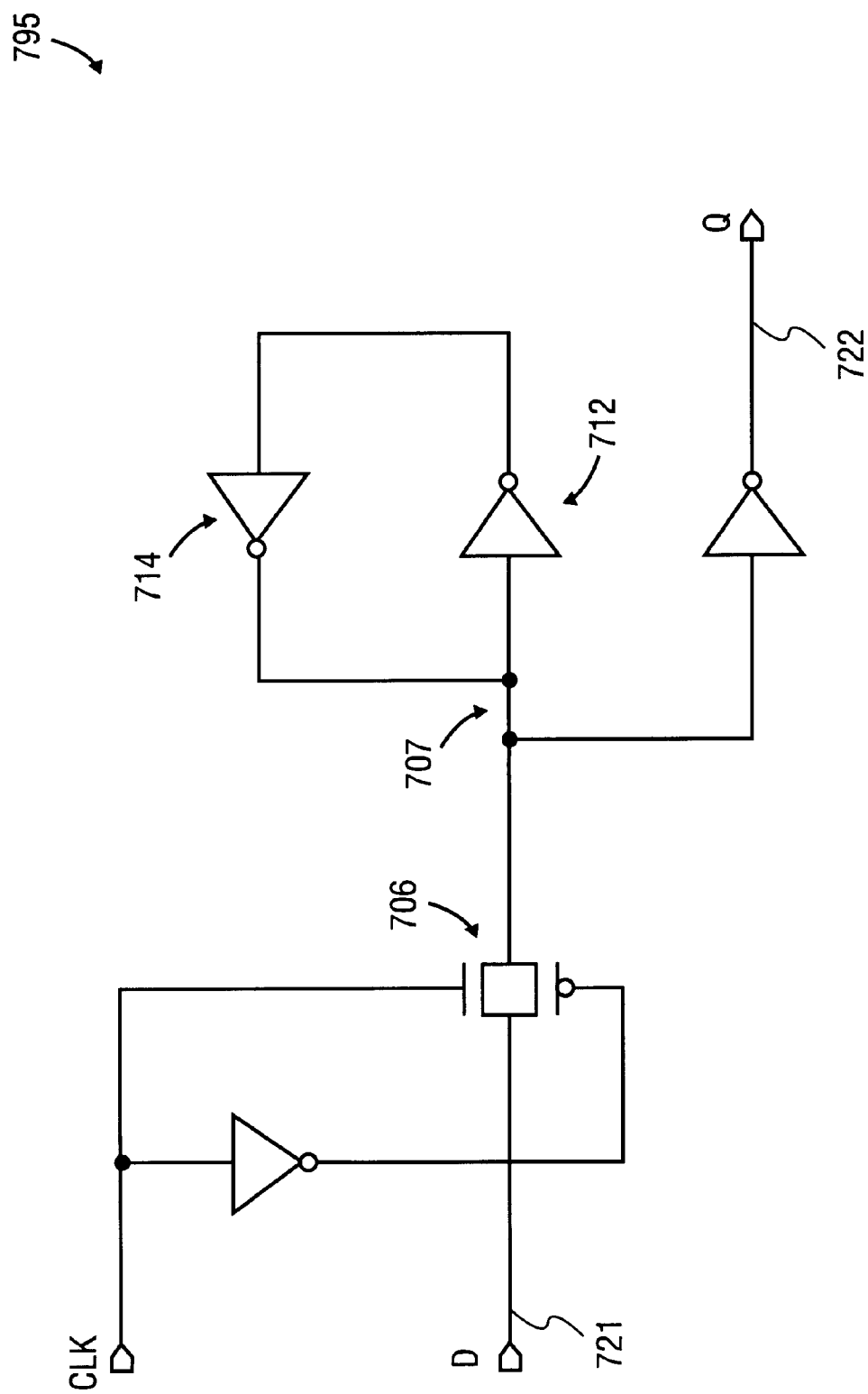
FIG. 7B illustrates one embodiment of a high transparent latch.

It should be noted that the circuitry for latches 590, 595, and 540 is shown in FIGS. 7A and 7B only for exemplary purposes. Other circuit configurations may be used to provide domino block 520 with stable inputs as described above with respect to FIG. 5.

FIG. 7A illustrates one embodiment of a low transparent latch. In low transparent latch 790, data at the input D 701 is passed through the latch to the output Q 702 when the clock input CLK is low. When CLK rises, pass gate 718 will close and the value at the storage node 717 will be held during the CLK high period. Inverter pair 712, 714 is a circuit configuration well known in the art that is used to ensure that the value at the storage node 717 is maintained statically.

FIG. 7B illustrates one embodiment of a high transparent latch. In high transparent latch 795, data at the input D 721 is passed through the latch to the output Q 722 when CLK is high. When CLK falls, pass gate 706 will close and the value at the storage node 707 will be held during the CLK low period.

The recirculating scheme described with respect to FIGS. 5 and 6, reduces the timing of the data path because there is no need to add latches in the data path to create stalls in the domino pipeline. Since the input signals to a domino gate at the clock boundary do not have to pass through latches, the delay of the input signals may be reduced by the larger of the propagation delay through a latch or the setup time of a latch. This potentially allows for a processor to be operated at a higher frequency.

Furthermore, the timing of the control path may also be reduced. The enable input signal 416 applied to latches 30, 40, and 50 of FIG. 1 has a setup time associated with it. The setup time is the amount of time before applying CLK signal to latches 30, 40, and 50 that the enable signal must be applied to ensure proper operation of the latches. The enable signal is generated from several signals coming from different locations in the processor and is connected to multiple latches. These loads add RC (i.e., resistance and capacitive) delay to the signal necessitating a setup time before the signal may be used.

The data inputs to latches have a similar requirement of a setup time. However, the setup time required for the enable input is larger than the setup time for the data inputs. As such, the setup time for latch 540 of FIG. 5 will be less than the setup time for enable latches 30, 40, and 50 of FIG. 1 because the enable signal is applied to the data input of latch 540. For example, in one embodiment, the setup time of the enable inputs may be approximately 0.41 nanoseconds (ns) whereas the setup time for the data input may be approximately 0.28 ns. By using latch 540 of FIG. 5, the enable signal may be used in the next phase in the recirculating structure without the required setup time associated with the prior art data input latches, thereby reducing the total delay of the pipeline. This may also potentially allow the processor to be operated at a higher frequency.

In addition, the area of the processor may also be reduced. Rather than adding stallable latches to all the data inputs, only one recirculating structure is added for each output of the domino block. For example, an 8 input multiplexer requires 16 enable latches at its data input (8 for the data path and 8 for the selects) using the prior art structure. If the data is 128 bit wide, then 1032 (8*128+8) enable latches would be used. Assuming, for example, that each latch is constructed with 32 devices, then a total of approximately 33000 devices would be required. However, with the present scheme, only 128 recirculating structures (each structure constructed with 32 devices) consisting of approximately 4000 devices would be required. This reduces the area of the processor for the same functionality. Furthermore, the enable signal only needs to be connected to 128 latches instead of 1024 enable latches, thereby reducing the fan-out by a factor of 8. The smaller load on the enable signal may result in a faster delay and a lower power dissipation.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A circuit for stalling data, comprising:
   a logic network having a plurality of inputs coupled to receive a plurality of input data signals, the logic network to generate an output signal on an output node based on a logic evaluation of the plurality of input data signals; and
   a feedback circuit coupled to the logic network to maintain the output signal on the output node based on a stall input signal.

2. The circuit of claim 1, further comprising:
   a first transistor coupled to the output node to precharge the output node and a second transistor coupled to the logic network; and
   a clock signal, the clock signal having a precharge cycle and an evaluation cycle, the clock signal coupled to the second transistor to activate the logic network during the evaluation cycle and to deactivate the logic network during the precharge cycle, the clock signal coupled to the first transistor to precharge the output node during the precharge cycle.

3. The circuit of claim 2, wherein the feedback circuit comprises:
   a third transistor coupled in series between the output node and the second transistor to deactivate the logic network; and
   a fourth and a fifth transistors coupled in series between the output node and the second transistor, the fourth transistor coupled to receive the stall input signal, the fifth transistor coupled to receive a recirculating input signal generated from the output signal.

4. The circuit of claim 3, wherein the feedback circuit further comprises:
   a first latch coupled to the output node; and
   a second latch coupled between the first latch and the fifth transistor, the first and the second latch generating the recirculating input signal.

5. The circuit of claim 3, wherein the first transistor is a p-channel transistor and wherein the second, the third, the fourth, and the fifth transistors are n-channel transistors.

6. The circuit of claim 4, wherein the first latch is a high transparent latch.

7. The circuit of claim 4, wherein the second latch is a low transparent latch.

8. The circuit of claim 4, further comprising an inverter coupled to the enable signal to generate the stall signal.

9. The circuit of claim 4, further comprising a high skew logic gate coupled in series between the output node and the first latch.

10. The circuit of claim 4, further comprising:
    a first inverter having an input and an output; and
    a second inverter having an input and an output, the output of the first inverter coupled in series with the input of the second inverter, the output node coupled to the input of the first inverter and the output of the second inverter.

11. A processor, comprising:
    a clock generator to generate a plurality of clock signals; and
    a domino pipeline comprising:
        a plurality of first logic gates controlled by the plurality of clock signals, the plurality of first logic gates coupled in series and grouped to operate in a plurality of clock half cycles; and
        a logic block positioned at a start of one of the plurality of clock half cycle groups, the logic block comprising:
            a logic network having a plurality of inputs coupled to receive a plurality of input data signals, the logic network to generate an output signal on an output node based on a logic evaluation of the plurality of input data signals;
            a first transistor coupled to the output node to precharge the output node and a second transistor coupled to the logic network; and
            a feedback circuit coupled to the logic network to maintain the output signal on the output node based on a stall input signal.

12. The processor of claim 11, wherein the logic block is controlled by one of the plurality of clock signals, the one of the plurality of clock signals having a precharge cycle and an evaluation cycle, the one of the plurality of clock signals coupled to the second transistor to activate the logic network during the evaluation cycle and to deactivate the logic network during the precharge cycle, the clock signal coupled to the first transistor to precharge the output node during the precharge cycle.

13. The processor of claim 12, wherein the feedback circuit comprises:
    a third transistor coupled in series between the output node and the second transistor to deactivate the logic network; and
    a fourth and a fifth transistors coupled in series between the output node and the second transistor, the fourth transistor coupled to receive the stall input signal, the fifth transistor coupled to receive a recirculating input signal generated from the output signal.

14. The processor of claim 13, wherein the feedback circuit further comprises:
    a first latch coupled to the output node; and
    a second latch coupled between the first latch and the fifth transistor to transmit the recirculating input signal.

15. The circuit of claim 13, wherein the first transistor is a p-channel transistor and wherein the second, the third, the fourth, and the fifth transistors are n-channel transistors.

16. A method for stalling data, comprising:
    receiving the plurality of data input signals at a plurality of first inputs of a logic block, the logic block having a second input, a stall input, and an output;
    generating a first output signal on the output of the logic block based on a logic evaluation of the first plurality of inputs during a first clock cycle;

receiving a stall signal at the stall input of the logic block;

recirculating the first output signal to the second input of the logic block during the first clock cycle; and transmitting the output signal received at the second input to the output of the logic block based on a stall signal.

17. The method of claim 16, wherein the logic block further comprises an enable input and wherein the method further comprises:

receiving a second plurality of data input signals at the plurality of first inputs of the logic block;

receiving an enable signal at the enable input;

terminating the transmission of the first output signal received at the second input; and generating a second output signal on the output of the logic block based on a logic evaluation of the second plurality of data input signals during the first clock cycle.

18. The method of claim 17, further comprising generating a third output signal on the output of the logic block during a second clock cycle.

19. The method of claim 18, wherein the first clock cycle is an evaluation half cycle and the second clock cycle is a precharge half cycle.

* * * * *